(12) United States Patent
Noelscher et al.

(10) Patent No.: US 8,043,794 B2
(45) Date of Patent: Oct. 25, 2011

(54) METHOD OF DOUBLE PATTERNING, METHOD OF PROCESSING A PLURALITY OF SEMICONDUCTOR WAFERS AND SEMICONDUCTOR DEVICE

(75) Inventors: Christoph Noelscher, Nuremberg (DE); Yi-Ming Chiu, Dresden (DE); Yuan-Hsun Wu, Dresden (DE)

(73) Assignee: Qimonda AG, München (DE)

( * ) Notice: Subject to any disclaimer, the term of this patent is extended or adjusted under 35 U.S.C. 154(b) by 747 days.

(21) Appl. No.: 12/024,872

(22) Filed: Feb. 1, 2008

(65) Prior Publication Data
US 2009/0194840 A1    Aug. 6, 2009

(51) Int. Cl.
G03F 7/00 (2006.01)
G03F 7/20 (2006.01)
G03F 7/26 (2006.01)
G03F 7/40 (2006.01)

(52) U.S. Cl. ........... 430/312; 430/270.1; 430/311; 430/317; 430/322; 430/330; 430/331; 430/394

(58) Field of Classification Search ........... 430/270.1, 430/311, 312, 322, 317, 330, 331, 394
See application file for complete search history.

(56) References Cited

U.S. PATENT DOCUMENTS

| | | | | |
|---|---|---|---|---|
| 5,686,223 A * | 11/1997 | Cleeves | | 430/312 |
| 5,741,625 A * | 4/1998 | Bae et al. | | 430/312 |
| 5,814,834 A * | 9/1998 | Yamazaki et al. | | 257/59 |
| 6,074,900 A * | 6/2000 | Yamazaki et al. | | 438/164 |
| 6,406,834 B1 * | 6/2002 | Kuit et al. | | 430/311 |
| 6,569,605 B1 * | 5/2003 | Bae | | 430/316 |
| 6,586,754 B1 * | 7/2003 | Hultermans | | 250/492.2 |
| 6,803,178 B1 * | 10/2004 | Subramanian et al. | | 430/394 |
| 6,998,198 B2 * | 2/2006 | Lin et al. | | 430/5 |
| 7,005,215 B2 * | 2/2006 | Pierrat | | 430/5 |
| 7,011,936 B2 * | 3/2006 | Nolscher et al. | | 430/394 |
| 7,033,735 B2 * | 4/2006 | Ho et al. | | 430/312 |
| 7,368,225 B1 * | 5/2008 | Subramanian et al. | | 430/311 |
| 7,566,526 B2 * | 7/2009 | Yang | | 430/322 |
| 7,582,413 B2 * | 9/2009 | Chen | | 430/322 |
| 2005/0064343 A1 | 3/2005 | Romanato et al. | | |
| 2005/0208430 A1 | 9/2005 | Colburn et al. | | |
| 2006/0024621 A1 | 2/2006 | Nölscher et al. | | |
| 2006/0160028 A1 | 7/2006 | Lee et al. | | |
| 2006/0216649 A1 * | 9/2006 | Paxton et al. | | 430/311 |
| 2008/0153300 A1 * | 6/2008 | Bok | | 438/703 |
| 2008/0199814 A1 * | 8/2008 | Brzozowy et al. | | 430/312 |
| 2008/0305642 A1 * | 12/2008 | Lee et al. | | 438/703 |

OTHER PUBLICATIONS

Lee, S., et al., "Double exposure technology using silicon containing materials," Advances in Resist Technology and Processing XXIII, edited by Qinghuang Lin, Mar. 2006, pp. 61531K-1-61531K-7, Proc. of SPIE, vol. 6153, SPIE.

Lim, C-M., et al., "Positive and Negative Tone Double Patterning Lithography for 50nm Flash Memory," Optical Microlithography XIX, edited by Donis G. Flagello, Apr. 2006, pp. 615410-1-615410-8, Proc. of SPIE, vol. 6154, SPIE.

Vanleenhove, A., et al., "A litho-only approach to double patterning," Optical Microlithography XX, edited by Donis G. Flagello, Mar. 2007, 10 pages, Proc. of SPIE, vol. 6520, SPIE.

* cited by examiner

Primary Examiner — Amanda C. Walke
(74) Attorney, Agent, or Firm — Cozen O'Connor

(57) ABSTRACT

A method of double patterning is disclosed. The method includes forming a first photosensitive layer; exposing the first photosensitive layer using a first reticle; developing the first photosensitive layer thereby forming a first image pattern including first elements; forming a second photosensitive layer; exposing the second photosensitive layer using the first reticle; and developing the second photosensitive layer thereby forming a second image pattern.

24 Claims, 9 Drawing Sheets

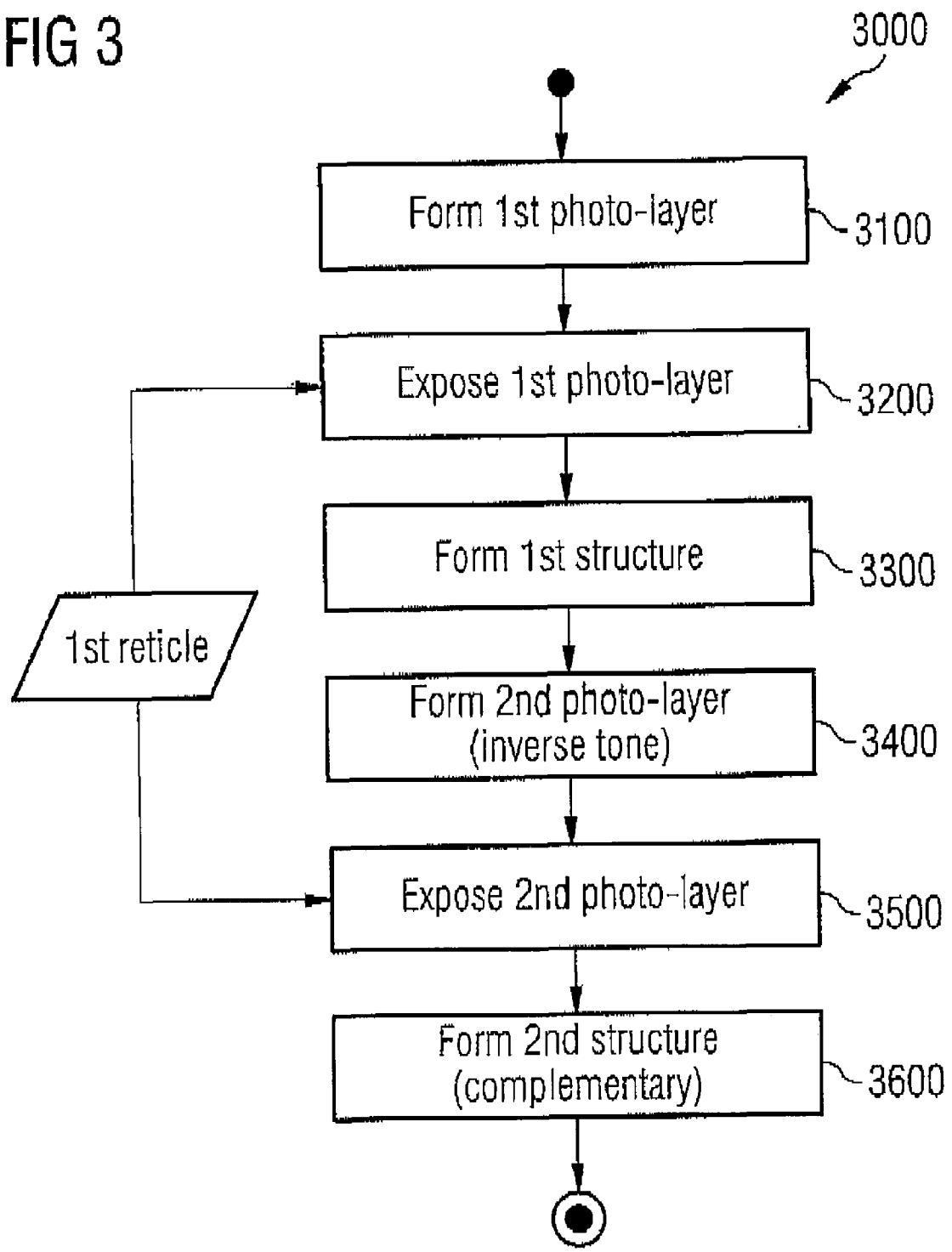

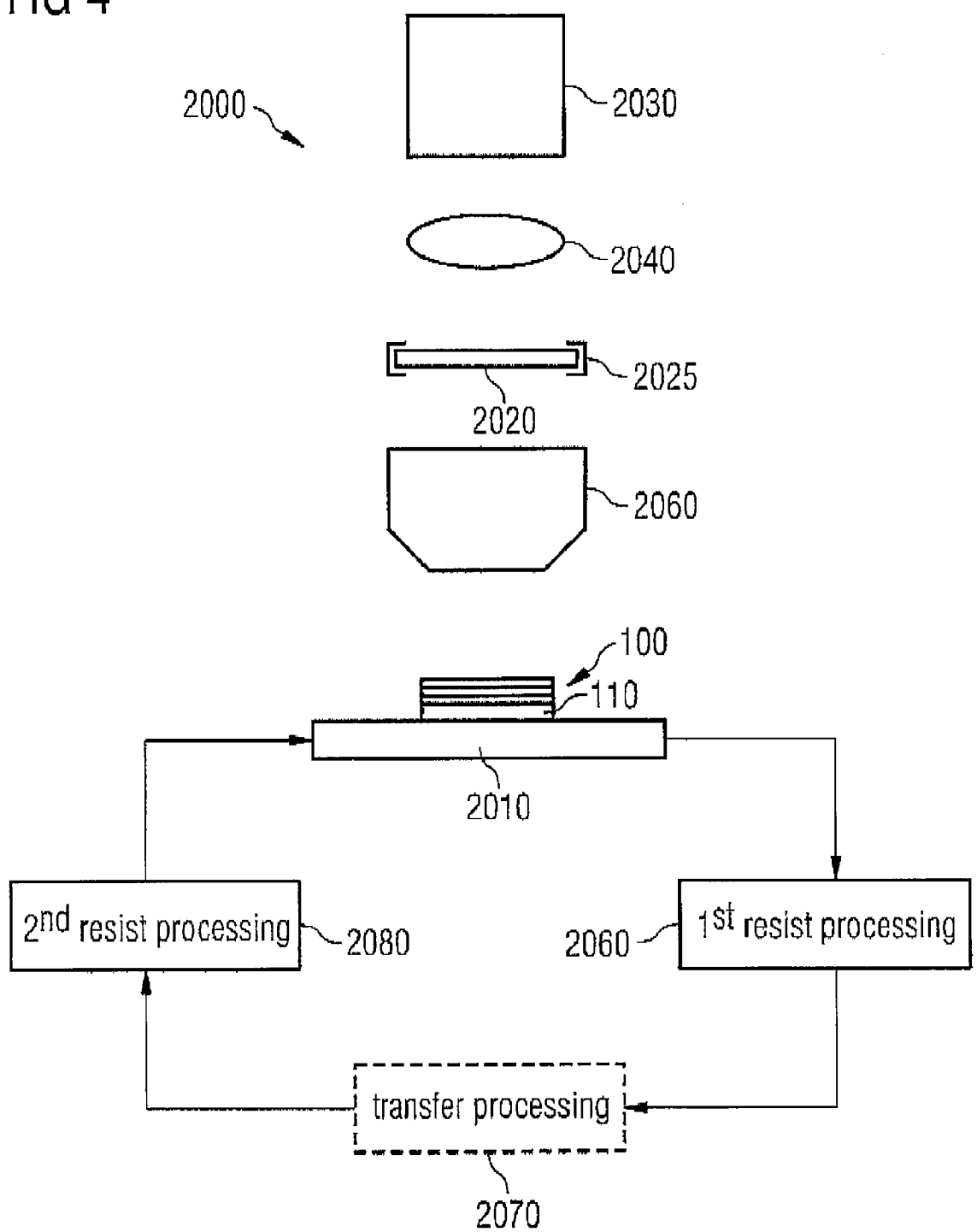

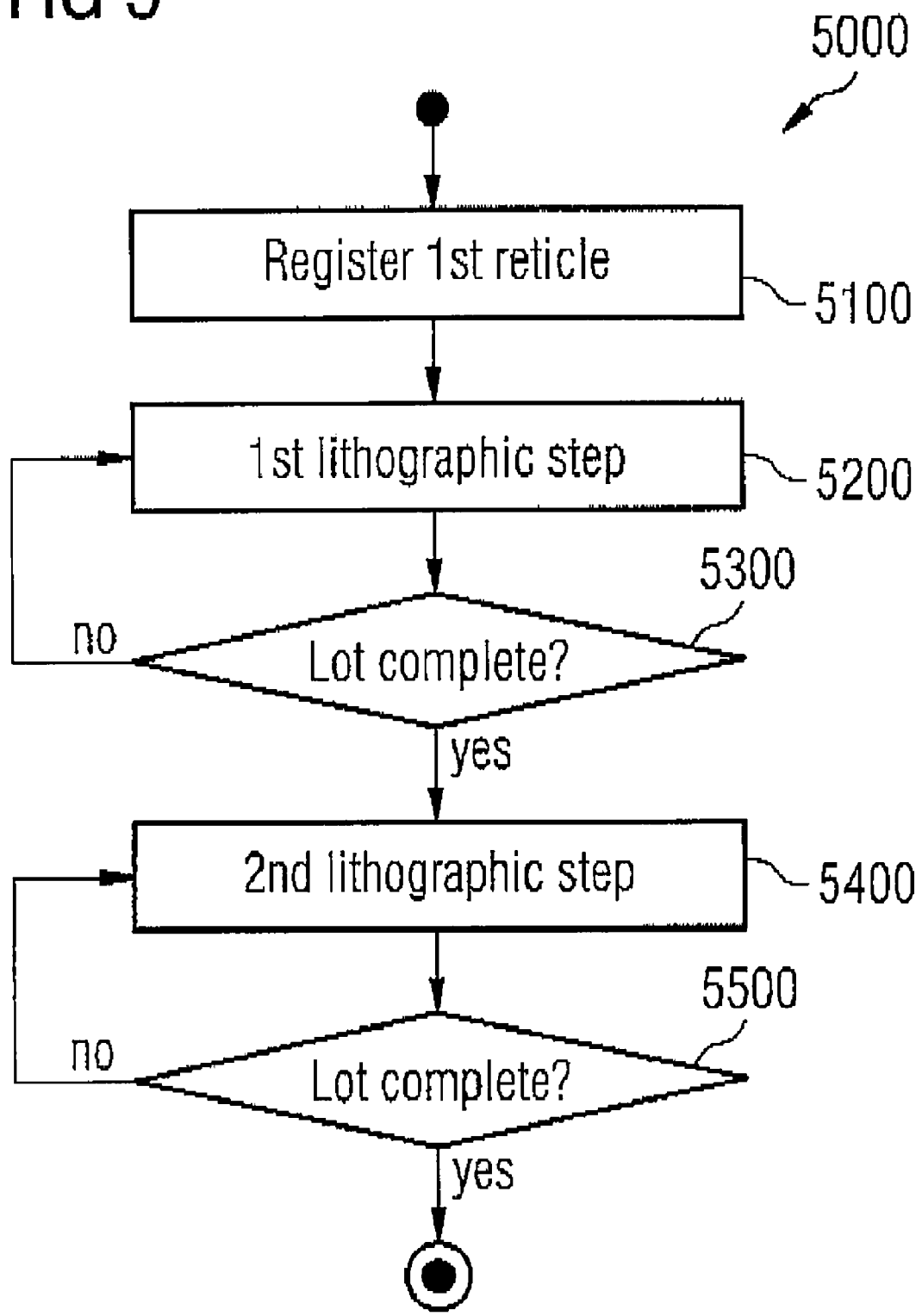

METHOD OF DOUBLE PATTERNING, METHOD OF PROCESSING A PLURALITY OF SEMICONDUCTOR WAFERS AND SEMICONDUCTOR DEVICE

BACKGROUND

Embodiments of the invention relate to methods of double patterning, a method of processing a plurality of semiconductor wafers and a semiconductor device created by methods disclosed.

In general, such methods may be used in the manufacturing of dense patterns on a semiconductor surface. In double patterning two subsequent lithographic processing steps are performed. The present invention addresses, among others, issues such as improving alignment between subsequently exposed patterns and the efficient manufacturing of more complex structures.

BRIEF DESCRIPTION OF THE DRAWINGS

In the accompanying drawings:

FIG. 3 shows a flow chart of a method of double patterning;

FIG. 4 shows a system and workflow for processing a plurality of semiconductor wafers; and FIG. 5 shows a flow chart of a method of processing a plurality of semiconductor wafers.

DETAILED DESCRIPTION OF ILLUSTRATIVE EMBODIMENTS

In the following, several methods of double patterning and semiconductor devices will be described in further detail in order to highlight various aspects of the present invention. It should be appreciated, however, that the present invention is applicable to many other processes and systems and should not be limited by the embodiments and implementations described.

In a double patterning process, at least two photosensitive layers or materials of a layer stack are exposed and developed in two subsequent lithographic processing steps. In doing so, denser or generally more complex patterns may be created on a surface of the layer stack. In contrast, in a double exposure process, a single photosensitive layer is exposed twice using two subsequent lithographic projection steps without an intermediate resist processing step.

In the following, the implementations of methods and devices are described with respect to simplifying a manufacturing process and improving pattern density of manufactured devices. However, the inventive methods and devices may also be useful in other respects, for example, in reducing costs, allowing production of more elaborate layouts, enhancing yields or the like.

Furthermore, it should be noted that the implementations are described with respect to the manufacturing of dense line space patterns of semiconductor memory devices but might also be useful in other respects, including but not limited to the manufacture of dense patterns or semi-dense patterns and combinations of such patterns. The methods of double patterning may also be applied during manufacturing of other semiconductor devices and other products, for example, thin film elements, liquid crystal panels, or the like.

Figure 1A:
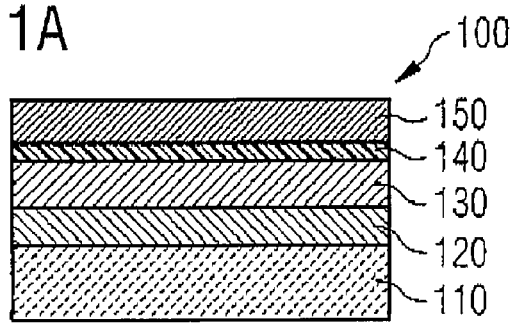
FIGS. 1A to 1H and 1J to 1M show a layer stack during different processing steps according to a first implementation of a method of double patterning.

FIG. 1A shows a cross-section through a layer stack 100 according to the first implementation. The layer stack 100 comprises a substrate 110. The substrate 110 may be an unstructured semiconductor wafer or a wafer already comprising one or several structured layers. The substrate 110 may comprise various materials known from the art, such as silicon, germanium, or gallium-arsenide, either doped or undoped. It may also comprise conductive or non-conductive materials, such as glass, polymer or any other carrier material used in a manufacturing process.

The substrate 110 is coated with a first hard mask layer 120 and, on top of that, a second hard mask layer 130. For example, an amorphous silicon layers may be used as hard mask layers 120 and 130. In the process described below, the first and second hard mask layers 120 and 130 are used to transfer patterns from a photosensitive layer to the substrate 110. However, other processes are known in which patterns are transferred directly from a photosensitive layer to a substrate 110. Consequently, the inventive concept may also be applied in layer stacks comprising a single or no hard mask layer at all.

Referring again to FIG. 1A, a bottom anti-reflection coating (BARC) layer 140 is arranged on top of the second hard mask layer 130. The BARC layer 140 prevents or largely reduces unwanted reflections of electromagnetic radiation during exposure of the layer stack 100. Depending on the lithographic processing system and method used, the BARC layer 140 may not be required for processing.

In addition to the layers presented in FIG. 1A, further layers such as a top anti-reflection coating (Top-ARC), an anti-scattering coating (ASC), a contrast enhancing layer (CEL) or other layers may also be included in the layer stack 100. However, these are not shown in the accompanying drawings for reasons of representational simplicity.

On top of the BARC layer 140, a first photosensitive layer 150 is arranged. The first photosensitive layer 150 comprises a positive photoresist material. The first photosensitive layer 150 may be applied to the layer stack 100 by spin coating, for example. The photosensitive layer may further include a photoacid generator (PAG) as a photoactive compound so as to form a chemically amplified resist (CAR).

Figure 1B:
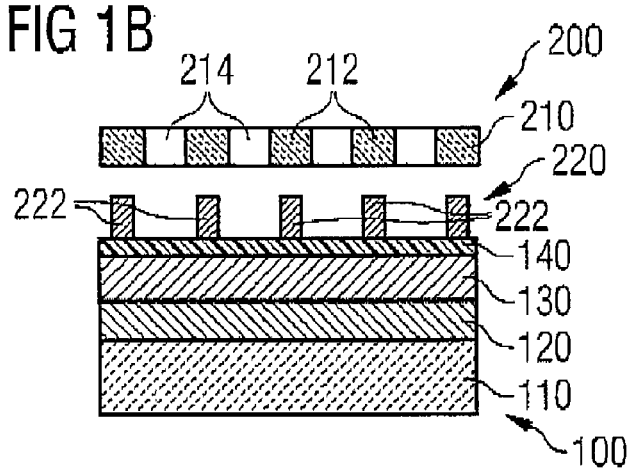

FIG. 1B shows the layer stack 100 after a first exposure and development step. In particular, the layer stack 100 is exposed using a reticle 200 comprising a mask pattern 210. The mask pattern 210 comprises radiation absorbing or attenuating areas 212 and radiation transmitting areas 214.

Electromagnetic radiation from a source, for example, an excimer laser having a wavelength of about 193 nm, is used to illuminate the reticle 200 in a lithographic projection step, such that an image pattern 220 of the mask pattern 210 is projected onto the first photosensitive layer 150. The first image pattern 220 comprises first image elements 222 in areas corresponding to the radiation absorbing areas 212. Although not shown in the drawings, an immersion lithographic method may be employed in order to improve the resolution of the imaging process.

In the example shown in FIG. 1B, the width of the first image elements 222 is reduced with respect to the width of the radiation absorption area, for example, by overexposing the first photosensitive layer 150. That is, the lithographic projection step is prolonged with respect to a nominal radiation dose required for exposure of uncovered parts of the photosensitive layer 150.

After the exposure of the first photosensitive layer, a post exposure bake (PEB) step may be performed. Then, the first photosensitive layer comprising the image pattern 220 is developed making use of the solubility of photo chemically induced acid catalyzed reactions, resulting in a deprotection of photoresist material in parts other than the first image elements 222 of the first photosensitive layer 150. Other mechanisms may also be used in order to form the resulting first image elements 222 of the image pattern 220.

Figure 1C:
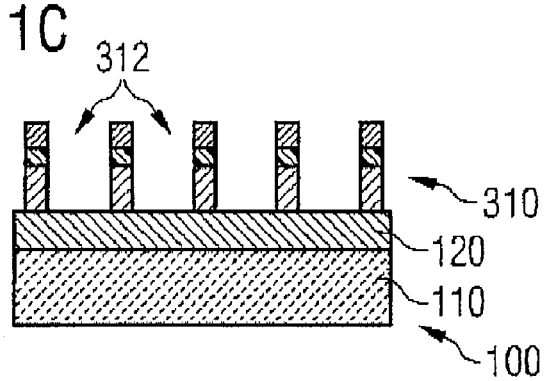

FIG. 1C shows the layer stack 100 after a first transfer process. The first transfer process may comprise one or several processing steps, such as a BARC removal step followed by an etching step. Various materials and processes for anisotropic etching of semiconductor materials are known from the art and may be applied in the first transfer process. These including simple processes, such as freezing the developed resist for a second coating. The details of generation of the image pattern 220 as known in the art may be employed. Upon completion, a first trench structure 310 comprising first trench elements 312 is created on top of the layer stack 100 as shown in FIG. 1C.

According to an alternative implementation not shown in the drawings, the image elements may also be formed using a conventional exposure dose, i.e., not using overexposing as described above. Instead, or in addition, a development step followed by a transfer process incorporates an over-etching technique. That is, although an image pattern in a photosensitive layer may have a usual pattern width around a half pitch of a practical resolution limit of the lithographic projection system, the resulting structure elements may be reduced in width by a limited horizontal etching procedure. The required horizontal etching may be performed in an additional etching step after development or within an etching step used for transferring the resulting structure elements to the hard mask layer 130 as described below.

Figure 1D:
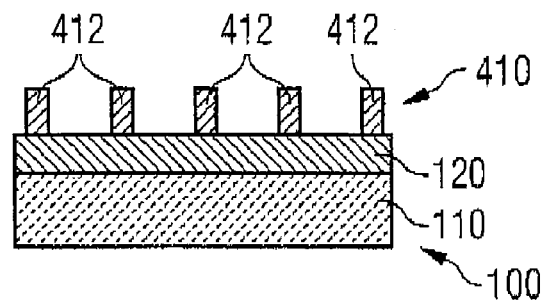

FIG. 1D shows the layer stack 100 after stripping of the first image elements 222 of the first photosensitive layer 150 and the remainder of the BARC layer 140. The remaining material of the second hard mask layer 130 now forms a first structure 410 comprising first structure elements 412.

Figure 1E:
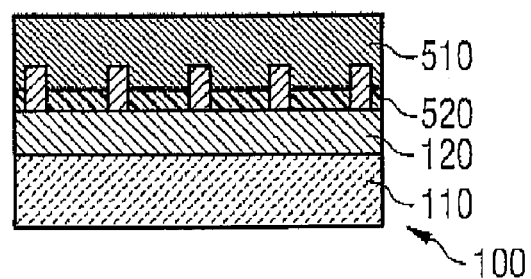

FIG. 1E shows the layer stack 100 after a coating process. In the presented implementation, a further BARC layer 520 and a second photosensitive layer 510 is coated on top of the layer stack 100. As detailed above, the BARC layer 520 may not be required in some lithographic processing systems, e.g., when the first BARC 140 layer is still present, or if the reflectivity of the substrate 110 is acceptable. In the situation depicted in FIG. 1E, the second photosensitive layer 510 covers all, or at least a significant part, of the top surface of the layer stack 100. The second photosensitive layer 510 comprises a negative photoresist material, i.e., its tone is the inverse of the tone of the resist of the first photosensitive layer 150.

Figure 1F:
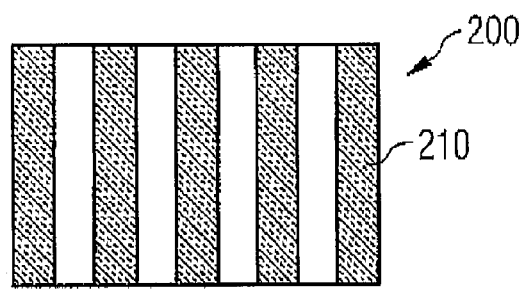
Figure 1G:
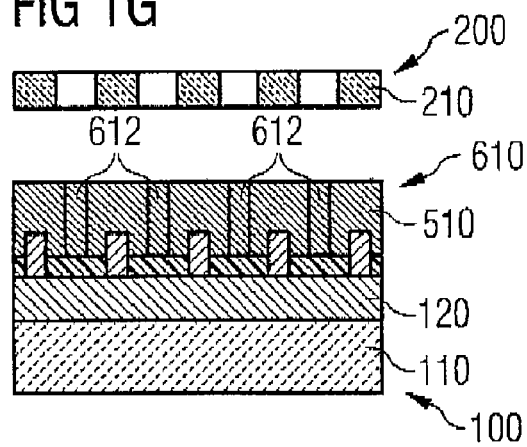

FIG. 1F shows a top view of the reticle 200 comprising the mask pattern 210. As shown in FIG. 1G, in a further processing step, the second photosensitive layer 510 is exposed using the same reticle 200 used in the first exposure step. Although the reticle 200 still comprises the same mask pattern 210 during exposure, a second image pattern 610 is formed in the second photosensitive layer 510. The second image pattern 610 comprises second image elements 612 arranged between the first structure elements 412. This is due to the fact that in the second exposure step a negative photoresist material is exposed.

Consequently, the second image pattern 610 is essentially complementary to the first image pattern 220. Complementary within the scope of this invention means that the image elements 612 lie in between other elements, like the first image elements 222 or the first structure elements 412. That is, two complementary image patterns 220 and 610 of the same tone, i.e., positive or negative, are not spatially overlapping. Complementary image pattern 220 and 610 may or may not be spatially separated, for example, by deliberately over- or under-etching, or, over- or under-exposing, one or both of the patterns. The use of complementary first and second image patterns 220 and 610 is particularly useful for processing regular structures, such as dense minimum resolution structures like bitlines or small features of memory cells of a memory array. However, as will be described later, the use of complementary first and second image patterns 220 and 610 may also be applied in a variety of other applications and circuit areas.

In order to form second image elements 612 having a smaller width than the width of the radiation transmitting areas 214, in the situation depicted in FIG. 1G, an underexposure of the second photosensitive layer 510 is performed, i.e., the process from the exposure to the development step results in a smaller width of elements 612. In consequence, a photochemical reaction throughout the entire depths of the second photosensitive layer 510 only takes place in a central area arranged between the first structure elements 412 in a second development step. Alternately, a conventional resist patterning step followed by a subsequent horizontal etching step may also be employed as described above.

Figure 1H:
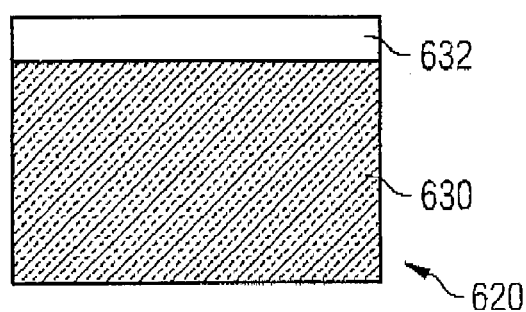

According to a further implementation, a further exposure step is performed using a second reticle 620. A top view of the second reticle 620 is presented in FIG. 1H. The reticle 620 comprises a further mask pattern 630 comprising a mask element 632. In the implementation presented, only a single mask element is present in the mask pattern 630. However, in practice, many more mask elements may be part of the mask pattern 630. Furthermore, according to the implementation presented in FIG. 1H, the mask element 632 comprises a light transmitting area. However, mask elements may also be formed by light attenuating areas.

Figure 1J:
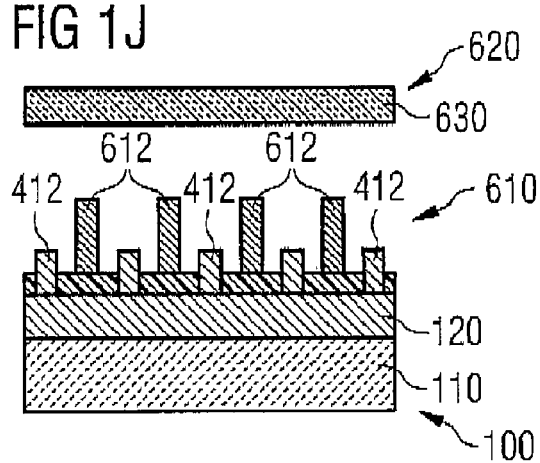

In an optional method step, the second photosensitive layer is exposed a second time using the second reticle 620. During the second exposure, the second image pattern 610 is modified. In the example presented, a further second image element is formed in the photosensitive layer. The further second image elements interconnect the first structure elements 412 and second image elements within the second photosensitive layer 510. FIG. 1J shows the layer stack 100 after a further development step in which the parts of the second photoresist layer 510 not comprising image elements 612 have been removed. Note that the additional image element corresponding to the mask element 632 is not visible in the cross-section presented in FIG. 1J.

Figure 1K:
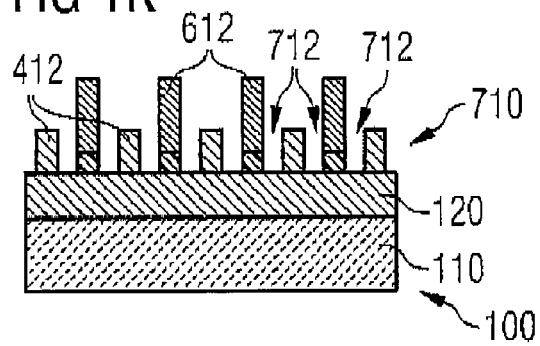

FIG. 1K shows the layer stack 100 after a further BARC opening process. After this process, the first hard mask layer 120 of the layer stack 100 is exposed in all areas not covered by the first structure elements 412 or the second image elements 612. Between these elements, second trench elements 712 form a high resolution second trench structure 710.

According to an alternative implementation, a more simple process comprises developing the second photosensitive layer 510 on the same BARC layer 140 as used for the first photosensitive layer 150 without any etching step in between. Many variations of the described processing steps can be applied to the present invention.

It should be noted that the second trench structure 710 may be twice as dense as a half pitch of the practical optical resolution limit of the used lithographic projection apparatus.

Figure 1L:
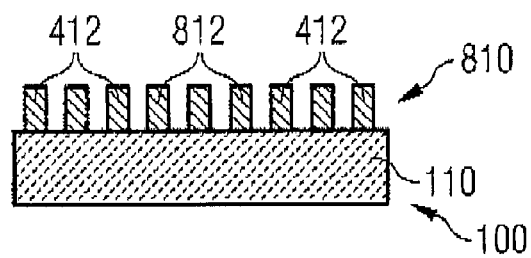

FIG. 1L shows a cross-section through the layer stack 100 after a further transfer process. In the example shown, the second transfer process comprises an etching process, transferring the first structure elements 412 and the second image elements 612 to the first hard mask layer 120. In a subsequent stripping process, the remaining photoresist material of the second photosensitive layer 510 and the remaining BARC layer 520 were removed. In consequence, a structure 810 comprising alternating first and second structure elements 412 and 812 is created on top of the substrate 110.

Figure 1M:
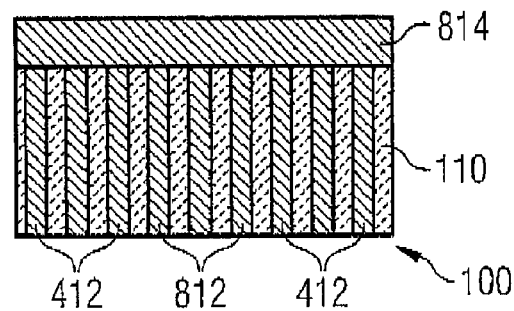

FIG. 1M shows a corresponding top view of the layer stack 100. In the top view, an additional structure element 814 corresponding to the mask element 632 of the second reticle 620 is shown. In the presented implementation, the additional structure element 814 forms an interconnecting feature for the first and second structure elements 412 and 812. The additional structure element may be used to form a common connection to a plurality of design features. For example, a common ground connection to a plurality of bitlines may be formed using the additional structure element 814.

In a subsequent step not shown in the drawings, the structure 810 may also be transferred to the top surface of the substrate 110, i.e., to the semiconductor material. In this step, a further etching process may be employed. Alternatively, the structure 810 may also be used as an implant mask for selectively doping the semiconductor material in areas not covered by the structure elements 412 and 812.

In the process described above with reference to FIGS. 1A to 1M, the same reticle 200 was used twice during two different lithographic exposure steps. Because the same reticle 200 could be used in both exposure steps, no further mask registration and mask alignment processes are required between the first and the second lithographic exposure step, thus simplifying the described method of double patterning and, at the same time, reducing alignment errors of the patterns created.

With respect to FIGS. 1A to 1M, a process for creating minimum resolution structures was described. However, many applications require the creation of a mixture of minimum and non-minimum resolution structures on a single surface of a substrate. In the following, a further implementation of a double patterning process allowing the creation of such structures is described.

FIGS. 2A to 2K show a layer stack 900 at various stages of a method of double patterning according to a second implementation. On the left-hand side of each one of FIGS. 2A to 2K, a cross-section through the layer stack 900 is shown. On the right-hand side of each one of the figures, a top view of the layer stack 900 at that particular processing stage is shown.

Figure 2A:
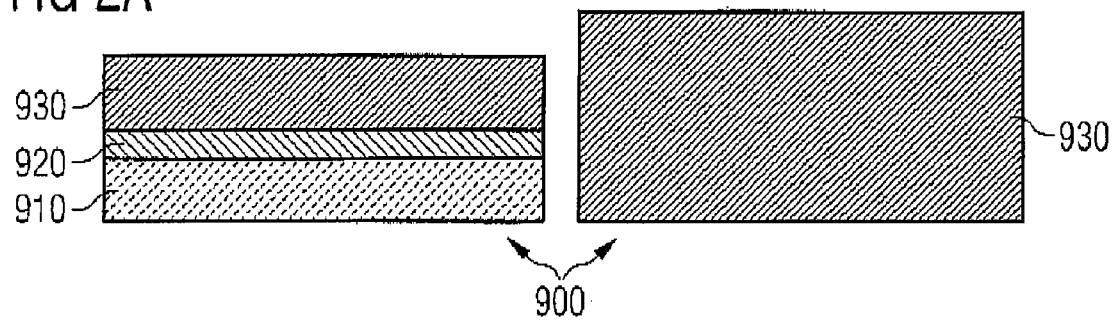
FIGS. 2A to 2K show a layer stack during different process steps according to a second implementation of a method of double patterning.

According to FIG. 2A, the layer stack 900 comprises a substrate 910, a hard mask layer 920 and a first photosensitive layer 930. In the implementation described, the first photosensitive layer 930 comprises a negative photoresist material.

Figure 2B:
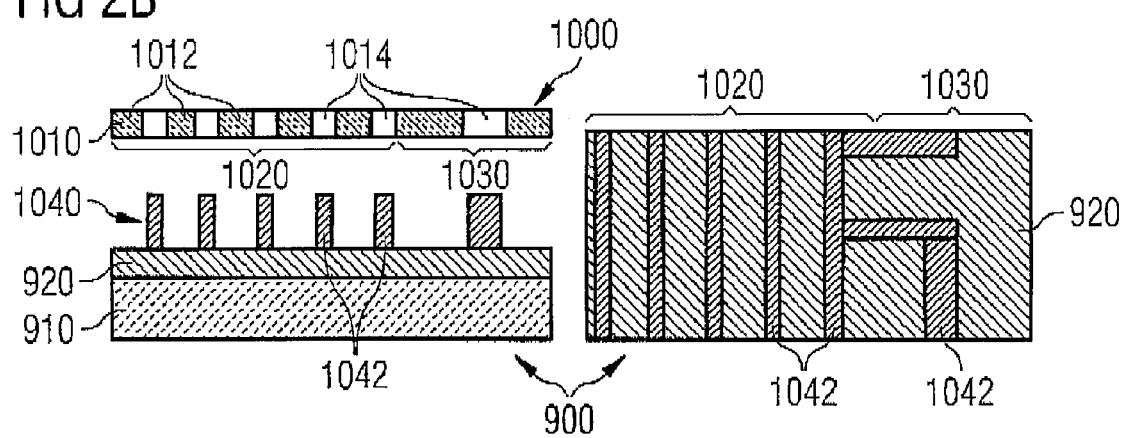

FIG. 2B shows the layer stack 900 after exposure and development performed by a lithographic projection apparatus using a reticle 1000. The reticle 1000 comprises a mask pattern 1010 having radiation absorbing, reflecting or attenuating areas 1012 and radiation transmitting areas 1014.

The mask pattern 1010 is divided into a first area 1020 and a second area 1030. The first area 1020 comprises a minimum distance, regular pattern. The second area 1030 comprises a less regular pattern with larger feature sizes, which can be used to create a support structure on the substrate 910.

According to this disclosure, a support structure is any irregular or non-minimum resolution structure arranged on the same surface as the minimum distance, essentially regular pattern. For example, in semiconductor memory devices, such as DRAMs or NROMs circuits, an array of memory cells arranged at minimum distance, is supported by further circuitry, such as selection transistors, read amplifiers and write circuitry, arranged in a peripheral part of a semiconductor substrate.

Referring to FIG. 2B again, in an exposure and development process step, a first image pattern 1040 of the first and second areas 1020 and 1030 comprising image pattern elements 1042 is created on the layer stack 900.

In the implementation described with reference to FIGS. 2A to 2K, a so-called cross-linking process is used after exposure. In this way, a further transfer step may be avoided. Cross-links are covalent bonds linking one polymer chain to another. They are the characteristic property of thermosetting polymer materials used in many photoresists. Cross-linking inhibits close packing of the polymer chains, preventing the formation of crystalline regions. This results in a restricted molecular mobility of the cross-linked structure.

Cross-links are formed by chemical reactions that are initiated by heat and/or pressure, or by the mixing of an unpolymerized or partially polymerized resin with specific chemicals called crosslinking reagents. Cross-linking can be induced in materials that are normally thermoplastic through exposure to radiation.

Figure 2C:
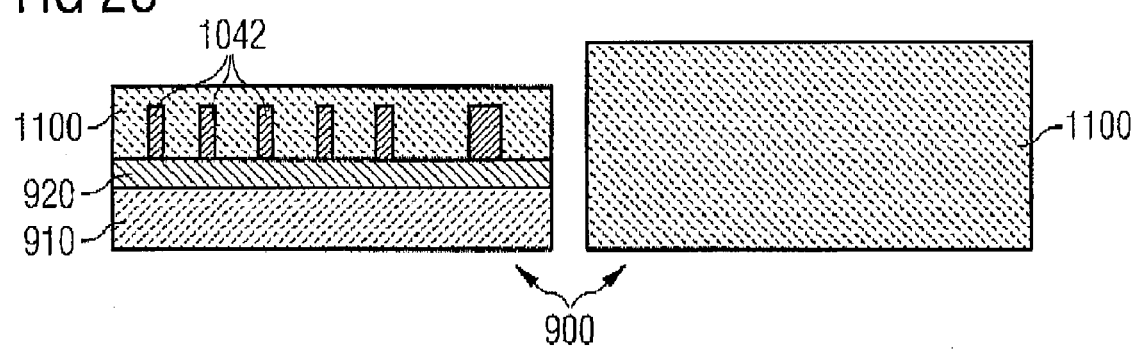

FIG. 2C shows the layer stack 900 after coating it with a cross-linking material 1100. The cross-linking material 1100 may be applied by spin-coating or other suitable methods as known by a person skilled in the art of lithography.

Figure 2D:
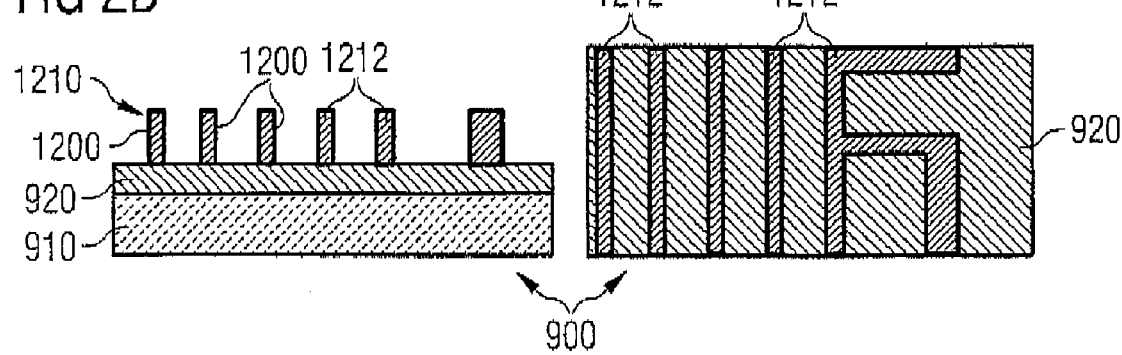

FIG. 2D shows the layer stack 900 after a so called cross-linking bake. During the cross-linking bake, the cross-linking material 1100 reacts with the first elements 1042. For example, the cross-linking material 1100 may cross-link a surface layer of the first elements 1042 with the aid of acid upon application of a heat treatment. After removal of the remaining cross-linking material 1100, a protective layer 1200 remains on the first image elements 1042. The protected image elements 1042 with the protective layer 1200 form first structure elements 1212 of a first structure 1210.

Figure 2E:
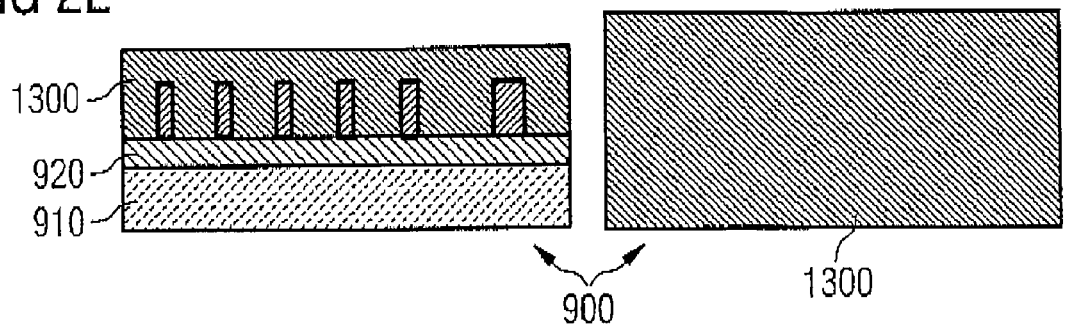

FIG. 2E shows the layer stack 900 after coating its top surface with a further photosensitive layer 1300. In the described implementation, the second photosensitive layer 1300 comprises a positive photoresist.

Figure 2F:
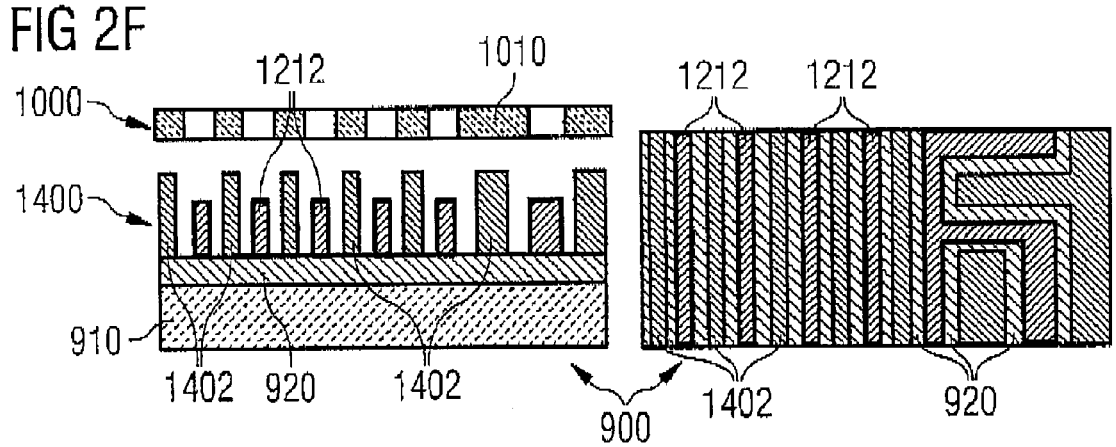

In the situation depicted in FIG. 2F, the second photosensitive layer 1300 has been exposed and developed using the reticle 1000 also used in the first exposure step. In consequence, a second image pattern 1400 is created on top of the layer stack 900. The second image pattern 1400 comprises second image elements 1402 arranged between the first structure elements 1212. The second image pattern 1400 is essentially complementary to the first structure 1210.

Figure 2G:
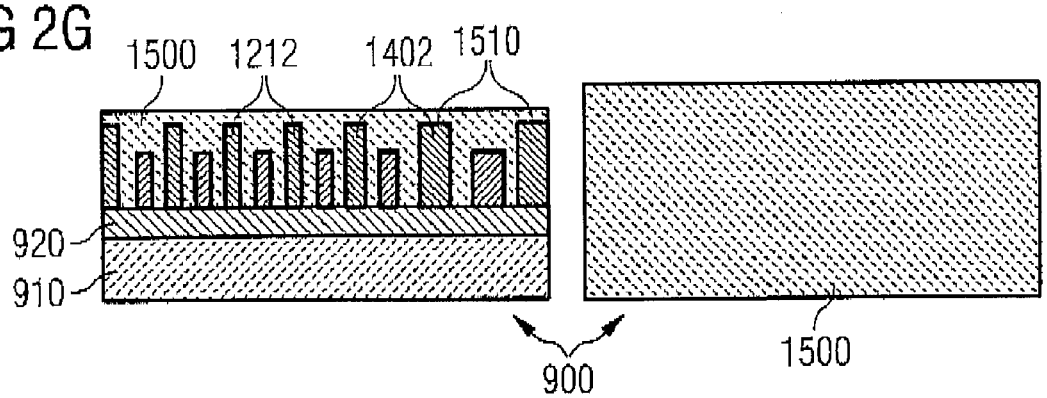

FIG. 2G shows the layer stack 900 being covered in a cross-linking material 1500. The cross-linking material 1500 may be identical to the cross-linking material 1100 used in the first cross-linking step shown in FIGS. 2C and 2D. As described before, a protective layer 1510 will be created surrounding the second image elements 1402, thus forming second structure elements 1512.

Figure 2H:
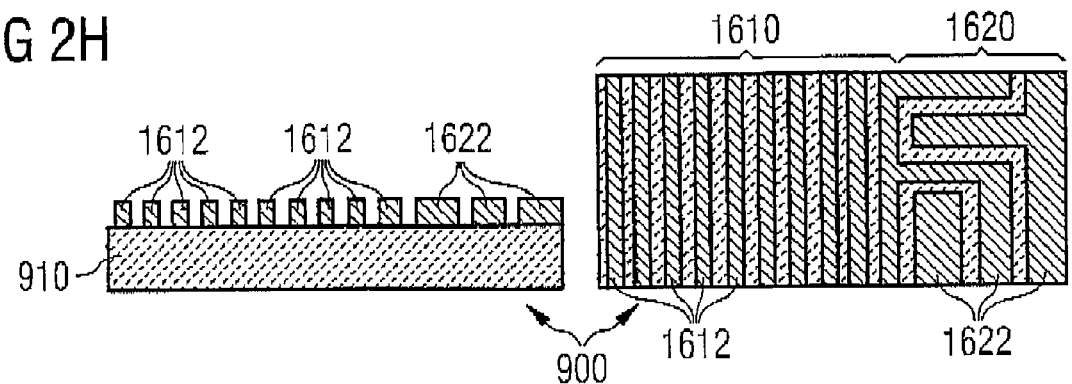

FIG. 2H shows the layer stack 900 after development of the cross-linking material 1500 and transfer of the first and second structure elements 1212 and 1512 to the hard mask layer 920. For this purpose, an etching process may be used.

The top view shown in the right-hand part of FIG. 2H shows a first structure 1610 and a second structure 1620. The first structure 1610 comprises a plurality of parallel elements 1612 used, for example, for etching of bitlines in a cell array or other regular structures. The second structure 1620 comprises a plurality of structure elements 1622 that are patterned in a less regular way. The second structure 1620 may be used as an etching mask for creating structures in a semiconductor material that will later form support electronic components of an array of memory cells as described above.

Figure 2I:
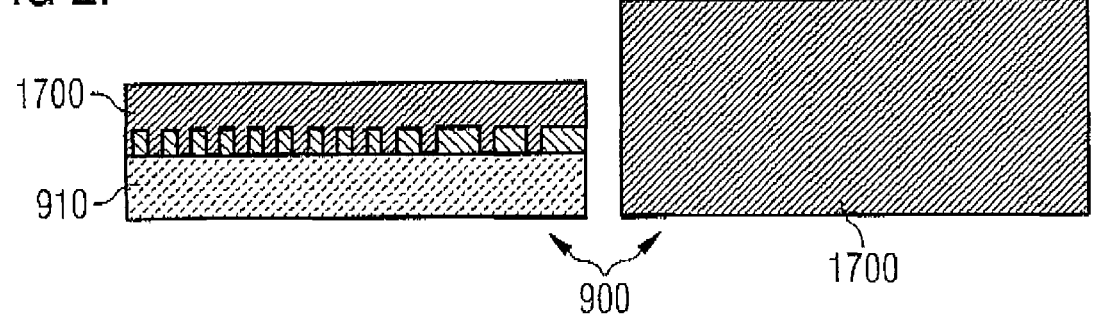

FIG. 2I shows the layer stack 900 after a further coating process. The further photosensitive layer 1700 comprises a photoresist material, for example, a positive photoresist. Alternatively, another type of photoresist, in particular a negative photoresist, may also be used according to another implementation of the invention.

Figure 2J:
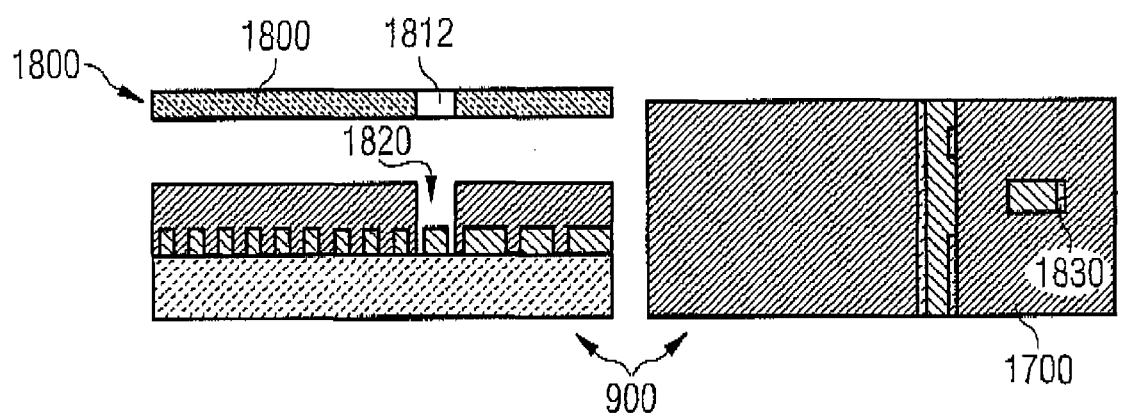
Figure 2K:
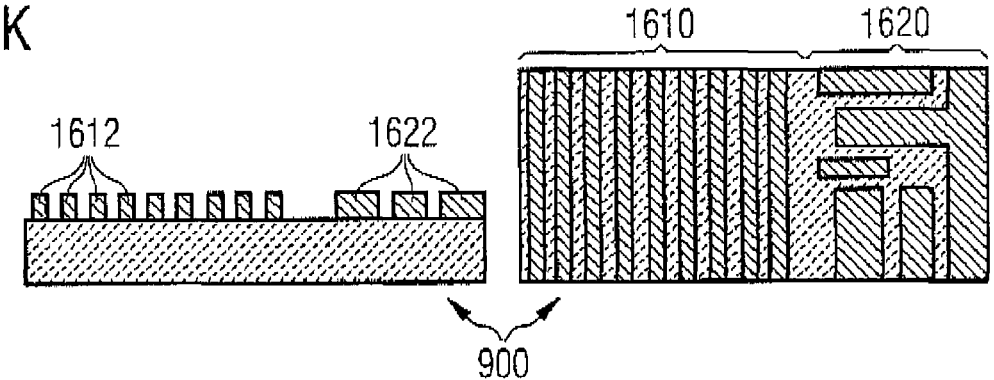

FIG. 2J shows the layer stack 900 after a further exposure and development step. During the exposure, a second reticle 1800 comprising a second mask pattern 1810 is used during exposure. In the cross-section shown in the left-hand part of FIG. 2J, only a single area 1812 for transmitting radiation is visible. However, in the top view shown on the right-hand part of FIG. 2J, one can see that the mask pattern 1810 comprises a further area for transmitting radiation.

After development of the third photosensitive layer 1700, a trimming gap 1820 in the third photosensitive layer 1700 is formed. Another trimming structure 1830 visible in the top-view is also formed. Also further patterns can be produced using the second reticle 1800 such as, for example, periphery device patterns.

After a further stripping and etching process, structure elements 1612 and 1622 co-located with the trimming gap 1820 or the trimming structure 1830 are etched of the first and second structure 1610 and 1620. As can be seen in the top view on the right-hand side of FIG. 2K, this etching process serves to separate the second area 1620, e.g., a support area, from the first area 1610, e.g. an array structure. In addition, different functional areas of the second structure, i.e., the support structure, are separated.

Although not shown in the drawings, this further lithographic process may also be used to trim individual structure elements 1612 to a common length or to create landing or contact pads at one of their ends. For example, alternating landing pad structures may be created on the top and bottom end of each one of the structures 1612, corresponding, for example, to bitlines of an array structure.

According to a further implementation not shown in the drawings, a double exposure technique as described with reference to FIGS. 1F to 1J is used in combination with the method of the double patterning described with reference to FIGS. 2A to 2K. In this implementation, a further exposure step using a second reticle is performed on the first and/or the second photosensitive layer, before the first or second image pattern is formed and transferred. Consequently, the first and/or second image pattern may be trimmed and/or interconnected using the second reticle. In this way, non-complementary first and second image patterns may be formed.

The methods described above are particular useful in the creation of semiconductor circuit structures. As has been described above, by partitioning a desired layout of a circuit to be implemented into two essentially complementary sets of pattern elements, creating a reticle with a mask pattern corresponding to one of the created patterns and performing a first and a second lithographic projection step using the created reticle on a positive and a negative photoresist layer, respectively, almost any kind of semiconductor circuitry may be produced with the inventive method of double patterning.

Semiconductor devices created in this way may have a first structure 1610 with a first center-to-center distance between individual elements 1612, and a second structure 1620 with a second center-to-center distance between individual elements 1622. While the center-to-center distance between every second element 1612 or 1622 of the structures 1610 and 1620, respectively, are always constant, neighboring elements 1612 or 1622 may by separated by trenches having different widths due to systematic offsets in the first and second exposure phase. However, the width of the trenches will typically lie within a small tolerance range, for example, within less than 20% of the average trench width. Furthermore, the distance between neighboring elements 1612 and 1622 is essentially the same, i.e., elements 1612 of the first structure 1610 have the distance to one another as elements 1622 of the second structure 1622 in areas, where no trimming was applied.

In addition to simplifying the creation of small feature-size structures on a variety of substrates as described above, implementations of the invention may also be employed in order to simplify the workflow during industrial-scale production of semiconductor devices. This will be described next with respect to a lithographic projection apparatus and its operation according to one implementation of the invention.

FIG. 3 show a flow chart of a method 3000 of double patterning in accordance with the implementations described above. In particular, two different photo layers, formed in steps 3100 and 3400 respectively, are exposed in steps 3200 and 3500 using the same reticle. As a result, two structures are formed in steps 3300 and 3600, respectively, which are essentially complementary to each other.

FIG. 4 shows a lithographic projection apparatus 2000. The lithographic projection apparatus 2000 comprises a substrate holder 2010. On the substrate holder 2010, a substrate 110 with a layer stack 100 is arranged. The substrate holder 2010 may hold one or several semiconductor wafers, for example.

The lithographic projection apparatus 2000 further comprises a mask holder 2020. The mask holder 2020 is adapted to hold a reticle 200 in position to project a mask pattern 210 to the layer stack 100. The lithographic projection apparatus 2000 further comprises a radiation source 2030, for example, an excimer laser operating at a wavelength of 193 nm. It further comprises illumination optics 2040 adapted to illuminate the reticle 200.

The lithographic projection apparatus 2000 further comprises a projection system 2050 for projecting the mask pattern 210 of the reticle 200 to a top surface of a layer stack 100. If an immersion lithographic process is employed, an immersion medium having a refraction index greater than 1 is provided between the projection system 2050 and the layer stack 100.

During exposure of a photosensitive layer 150 of the layer stack 100, a substrate holder 2010 holding the substrate 110 is loaded into the lithographic projection apparatus 2000. In addition, an associated reticle 200 is loaded into the lithographic projection apparatus 2000 and placed in the mask holder 2020. The reticle 200 is then registered by means of focusing and aligning it with a top layer of the stack 100 and, optionally, with a structure already present on the substrate 110.

According to the described implementation, two lithographic exposure processes are performed using a single reticle. Consequently, the reticle may remain in the mask holder 2020 during subsequent processing steps, reducing the risk of polluting or accidentally damaging the reticle. Furthermore, the risk posed by misalignment of the reticle to the exposure tool is practically eradicated. In addition, the registration error, i.e., the overlay error between two masks, is eliminated compared to a usual double patterning process, both for regular array and irregular support device patterns.

In an improved processing flow according to one implementation, a first layer stack 100 having a first type of photoresist in the top layer is exposed using a reticle 200 in a first exposure step. The layer stack 100 is then placed in a first resist processing apparatus 2060. According to the described implementation, the first resist processing apparatus 2060 includes a post exposure bake station and a development station. In an optional transfer processing apparatus 2070, image elements may be transferred to another layer of the layer stack 100. According to the described implementation, the transfer processing apparatus 2070 comprises an etch station and a cleaning station. The layer stack 100 is further coated with a second photosensitive layer 510 comprising a second type of photoresist in a second resist processing apparatus 2080. According to the described implementation, the second resist processing apparatus 2080 comprises a coating station and a soft bake station.

Without changing the reticle 200 in the mask holder 2020, the first substrate 110 now carrying the second photosensitive layer 510 with a different kind of photoresist on top is prepared for a second exposure step, in which the same reticle 200 is used once again. In this way, changing of the reticle 200 including a further mask registration process can be avoided. Even if the reticle had to be removed, e.g., by breakdown of the transfer stage, the alignment is improved due the same registration error of the reticle, and only one mask is necessary for the array.

In a further implementation, a plurality of layer stacks 100 is processed by use of the lithographic projection apparatus 2000. In order to streamline the workflow of the lithographic projection apparatus 2000, the size of a lot of semiconductor wafers is chosen to allow proceeding with the second exposure step of the first wafer once the last wafer has completed the first exposure step. In this way, continuous operation of the lithographic projection apparatus 2000 with a single mask 200 is enabled.

FIG. 5 shows a flow chart of a method 5000 of processing a plurality of semiconductor wafers according to the workflow described above. In a step 5100, a reticle 200 is registered with a lithographic projection apparatus 2000. Then, a first lithographic projection step is performed on a plurality of semiconductor wafers in a step 5200. After the end of the first lithographic projection step for the plurality of wafers is determined in step 5300, a second lithographic projection step is performed in step 5400. Again, step 5400 is repeated for each semiconductor wafer of a given lot as shown in step 5500.

Above, different implementations of methods for double patterning layer stacks comprising a substrate have been described in detail. It will be obvious to a person skilled in the art that the various features presented with respect to one particular implementation may also be combined with any of the other implementations described.

For example, the sequence of coating photosensitive layers comprising positive or negative photoresist material may be altered. Furthermore, different methods of transferring image patterns from a photoresist layer to another layer, including a hard mask layer or a layer of a substrate itself, may be employed. As has been shown above, the method is equally applicable to patterning regular and irregular structures, for example, memory arrays, connection terminals or support electronics. Furthermore, the various process steps may be employed as part of a more complex manufacturing process involving many more processing steps, including additional exposure and etching steps with the same or further reticles.

Having described various implementations of the invention, it is noted that modifications and variations can be made by a person skilled in the art in the light of the above teachings. It is therefore to be understood that changes may be made in the particular implementations of the invention disclosed which are within the scope and spirit of the invention as defined by the appended claims.

What is claimed is:

1. A method of double patterning comprising:
   forming a first photosensitive layer comprising a positive photoresist over a workpiece;
   exposing the first photosensitive layer using a first reticle comprising a first mask pattern;
   developing the first photosensitive layer thereby forming a first image pattern comprising first elements;
   forming a second photosensitive layer comprising a negative photoresist over the workpiece;
   exposing the second photosensitive layer using the first reticle comprising the first mask pattern; and
   developing the second photosensitive layer thereby forming a second image pattern comprising second elements arranged in areas between the first elements of the first image pattern.

2. The method according to claim 1, wherein the first mask pattern comprises at least one regular pattern for forming an essentially regular structure and one irregular pattern for forming a support structure.

3. The method according to claim 1, wherein in at least one of the steps of exposing the first and exposing the second photosensitive layer, at least one of an over-exposure technique and an under-exposure technique is employed.

4. The method according to claim 1, further comprising: transferring the first and the second image pattern to at least one of a hard mask layer or a surface layer of a semiconductor substrate.

5. The method according to claim 4, wherein transferring the first and second image pattern comprises at least one etching step, the at least one etching step, employing at least one of an over-etching technique and an under-etching technique.

6. The method according to claim 1, further comprising: exposing at least one of the first and second photosensitive layer using at least one second reticle comprising a second mask pattern in addition to exposing the respective photosensitive layer using the first reticle, the second mask pattern comprising at least one trimming area.

7. The method according to claim 1, further comprising:
   forming a third photosensitive layer comprising a positive or negative photoresist over the workpiece;
   exposing the third photosensitive layer using a second reticle comprising a second mask pattern comprising at least one trimming area; and
   developing the third photosensitive layer thereby forming a third image pattern comprising at least one trimming structure overlapping at least in part with at least one element of the first or second image pattern.

8. A method of double patterning a layer stack to create a structure, the structure comprising an essentially regular structure in at least one first area of a surface of a semiconductor material and a support structure in at least one second area of the surface of the semiconductor material, the method comprising:
   forming a first photosensitive layer comprising a negative photoresist;
   exposing the first photosensitive layer thereby forming a first pattern, the first pattern comprising first elements of the essentially regular structure and first elements of the support structure;
   forming a second photosensitive layer comprising a positive photoresist;
   exposing the second photosensitive layer thereby forming a second pattern, the second pattern comprising second elements of the essentially regular structure and second elements of the support structure, the second pattern being complementary with respect to the first pattern; and forming a third pattern comprising third elements of the essentially regular structure or the support structure in one of the first and the second photosensitive layer using a double-exposure technique, such that a second image pattern is non-complementary with respect to a first image pattern.

9. The method according to claim 8, wherein between exposing the first photosensitive layer and forming the second photosensitive layer, the first photosensitive layer is developed and the first pattern is transferred to a first mask layer.

10. The method according to claim 8, wherein between exposing the first photosensitive layer and forming the second photosensitive layer, the first photosensitive layer is developed and the first pattern is fixed using a crosslinking bake method.

11. The method according to claim 8, wherein the third elements trim or interconnect at least one of the first or second elements of the essentially regular structure.

12. The method according to claim 8, further comprising:
forming a third photosensitive layer comprising a positive or a negative photoresist; and
exposing the third photosensitive layer thereby forming a third pattern comprising third elements, the third elements overlapping with parts of at least one of the first and second elements.

13. The method according to claim 12, wherein the third elements trim or interconnect at least one of the first or second elements of the essentially regular structure.

14. The method according to claim 12, wherein the third elements separate the essentially regular structure from at least part of the support structure.

15. The method according to claim 8, further comprising: etching the surface of the semiconductor material using the first and second elements as an etching mask.

16. The method according to claim 8, further comprising: doping the surface of the semiconductor material using the first and second elements as a doping mask.

17. The method according to claim 8, further comprising:
doping the surface of the semiconductor material using elements of a first hard mask layer as a first doping mask, the elements of the first hard mask layer corresponding to the first elements of the first pattern; and
doping the surface of the semiconductor material using elements of a second hard mask layer as a second doping mask, the elements of the second hard mask layer corresponding to the second elements of the second pattern.

18. The method according to claim 17, wherein at least one of the first and the second hard mask layers comprises amorphous silicon.

19. A method of processing a plurality of semiconductor wafers, the method comprising:
registering a first reticle into a lithographic projection apparatus;
sequentially performing a first lithographic processing step on a first lot of semiconductor wafers using the first reticle; and
without a further registration step for the first reticle, sequentially performing a second lithographic processing step on the first lot of semiconductor wafers using the first reticle.

20. The method according to claim 19, wherein the second lithographic processing step is performed immediately after the first lithographic processing step without unloading the first reticle in between.

21. A semiconductor device, comprising
a surface layer, the surface layer comprising an essentially regular structure and a support structure,
wherein the essentially regular structure comprises
first and second elements, the second elements being essentially complementary in shape with respect to the first elements and being arranged between the first elements; and
wherein the support structure comprises
third and fourth elements, the fourth elements being essentially complementary in shape with respect to the third elements and being arranged between the third elements;
wherein a separation between neighboring first and second elements of the essentially regular structure corresponds to a separation between neighboring third and fourth elements of the support structure.

22. The semiconductor device according to claim 21, further comprising: at least one trimming structure separating the essentially regular structure and the support structure.

23. The semiconductor device according to claim 21, further comprising: at least one interconnection structure connecting at least two neighboring elements of at least one of the essentially regular structure and the support structure.

24. The semiconductor device according to claim 21, wherein the first and second elements form at least part of an array structure of a memory device and the third and fourth elements form at least part of a support electronic of a memory device.

* * * * *